(12) United States Patent
Molla et al.

(10) Patent No.: US 7,598,596 B2
(45) Date of Patent: Oct. 6, 2009

(54) METHODS AND APPARATUS FOR A DUAL-METAL MAGNETIC SHIELD STRUCTURE

(75) Inventors: Jaynal A. Molla, Gilbert, AZ (US); Gregory W. Grynkewich, Gilbert, AZ (US); Eric J. Salter, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 283 days.

(21) Appl. No.: 11/602,639

(22) Filed: Nov. 21, 2006

(65) Prior Publication Data
US 2008/0116535 A1 May 22, 2008

(51) Int. Cl.
*H01L 23/552* (2006.01)
*H01L 21/00* (2006.01)
*H01L 21/8246* (2006.01)

(52) U.S. Cl. .............................. 257/659; 257/E23.114; 257/E21.665; 438/57; 438/123

(58) Field of Classification Search ................ 257/422, 257/659, 508, 294, 295, E23.114, E21.665, 257/E21.502; 438/48, 57, 123
See application file for complete search history.

(56) References Cited

U.S. PATENT DOCUMENTS

| 5,225,951 | A  | * | 7/1993  | Kira et al. ................. 360/321 |
| 5,939,772 | A  |   | 8/1999  | Hurst et al. |
| 6,916,668 | B2 |   | 7/2005  | Spielberger et al. |
| 2002/0009820 | A1 | * | 1/2002  | Jung et al. .................... 438/31 |
| 2002/0186011 | A1 | * | 12/2002 | Murata et al. ............... 324/252 |
| 2002/0196119 | A1 | * | 12/2002 | Meigs et al. ................ 336/200 |
| 2004/0223265 | A1 | * | 11/2004 | Ohtomo et al. ............. 360/317 |
| 2005/0207263 | A1 | * | 9/2005  | Okayama et al. ............ 365/232 |
| 2006/0222821 | A1 | * | 10/2006 | Masai ........................ 428/174 |

* cited by examiner

*Primary Examiner*—Brook Kebede
*Assistant Examiner*—Maria Ligai
(74) *Attorney, Agent, or Firm*—Ingrassia, Fisher & Lorenz, P.C.

(57) ABSTRACT

A shield structure for shielding an electromagnetic-field-susceptible region of a semiconductor component (e.g., a magnetoresistive random access memory, or "MRAM") includes a stress-relief layer (e.g., electroplated Ni) formed over the semiconductor device in a shield region substantially corresponding to the electromagnetic-field-susceptible region, and a magnetic shield layer (e.g., an electroplated PERMALLOY or MUMETAL layer) mechanically coupled to the stress-relief layer within the shield region, wherein the magnetic shield layer has a stress condition that is substantially opposite of that of the stress-relief layer.

19 Claims, 3 Drawing Sheets

METHODS AND APPARATUS FOR A DUAL-METAL MAGNETIC SHIELD STRUCTURE

TECHNICAL FIELD

The present subject matter pertains to the field of semiconductor device technology, and more particularly pertains to methods and apparatus for providing magnetic shielding in semiconductor devices.

BACKGROUND

A wide assortment of semiconductor devices operate in conjunction with various forms of electromagnetic energy. Magnetoresistive random access memory (MRAM) devices, for example, typically include memory cells incorporating ferromagnetic films that are programmed using localized electromagnetic fields. Stray magnetic fields of significant strength generated external to the memory cell may cause operational errors—e.g., errors arising during the read and/or write operations. It is therefore desirable to shield such cells and other susceptible regions from external magnetic fields.

Prior art methods of shielding such components are unsatisfactory in a number of respects. For example, metals with known shielding properties such as PERMALLOY (80Ni/20 Fe) and MUMETAL (80Ni/13.5Fe/4.9Mo/0.5Mn/0.3Si) may be deposited over critical electromagnetic-field-susceptible devices. Such materials, however, which are often formed using an electroplating process, tend to give rise to high residual stresses. NiFe alloys, for example, generate significant tensile stresses. These stresses can result in significant wafer warpage, die-level fractures, deformation, and/or interfacial failure. Since shielding of semiconductor devices requires relatively thick films, the stress effects are significant enough that they can interfere with subsequent processing steps such as backgrinding, dicing, and the like. Additives may be supplied in the electroplating bath formulations to decrease the resulting internal stress of the plated alloy. However, such techniques have met with little success in substantially eliminating such stresses.

Accordingly, it is desirable to provide structures and methods for shielding susceptible semiconductor devices from unwanted electromagnetic fields, while reducing residual stresses. Other desirable features and characteristics will become apparent from the subsequent detailed description and the appended claims, taken in conjunction with the accompanying drawings and the foregoing technical field and background.

BRIEF DESCRIPTION OF THE DRAWINGS

A more complete understanding of the various embodiments may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the scope or application of possible embodiments. Furthermore, there is no intention to be bound by any expressed or implied theory presented in the preceding technical field, background, brief summary or the following detailed description.

Various embodiments may be described herein in terms of functional and/or logical block components and various processing steps. It should be appreciated that such block components may be realized by any number of hardware, software, and/or firmware components configured to perform the specified functions. For the sake of brevity, conventional techniques and components related to metal deposition, magnetic shielding, and semiconductor processing are not described in detail. The cross-sectional figures shown herein are not intended as scale drawings.

The terms "first," "second," "third," "fourth" and the like in the description and the claims, if any, may be used for distinguishing between similar elements and not necessarily for describing a particular sequential or chronological order. These terms, so used, are interchangeable under appropriate circumstances The embodiments of the invention described herein are, for example, capable of use in sequences other than those illustrated or otherwise described herein.

The terms "comprise," "include," "have" and any variations thereof are used synonymously to denote non-exclusive inclusion. The terms "left," right," "in," "out," "front," "back," "up," "down," and other such directional terms are used to describe relative positions, not necessarily absolute positions in space. The term "exemplary" is used in the sense of "example," rather than "ideal."

In general, various embodiments include a dual-metal shield structure for shielding an electromagnetic-field-susceptible region of a semiconductor device (e.g., an MRAM device). The shield structure includes a stress-relief layer (e.g., an electroplated Ni layer) formed over the semiconductor device in a shield region substantially corresponding to the electromagnetic-field-susceptible region, and a magnetic shield layer (e.g., an electroplated PERMALLOY or MUMETAL layer) formed adjacent to (e.g., on top of) the stress-relief layer within the shield region such that the two layers are mechanically coupled The magnetic shield layer has a stress condition that is substantially opposite of (and generally compensates for) the stress condition of the stress-relief layer.

Figure 1:
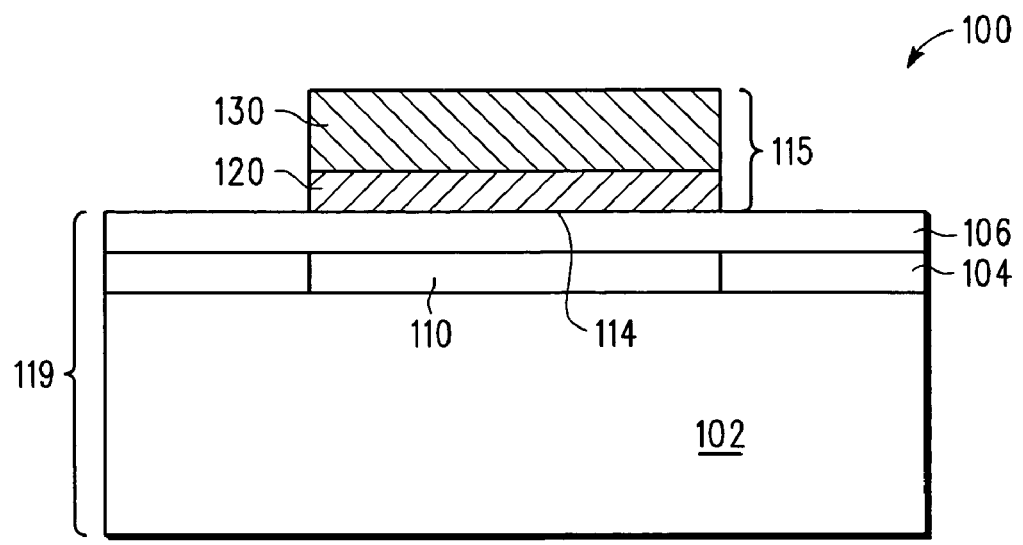
FIG. 1 is a simplified cross-sectional view of a semiconductor component with a shield structure in accordance with one embodiment.

Referring to FIG. 1, a semiconductor component 100 generally includes a substrate 102 and a semiconductor active region (or simply "region") 110 formed within and/or on substrate 102. Various other layers 106 and 104 maybe formed over region 110, depending upon the nature of component, as will be described in further detail below.

In the illustrated embodiment, region 110 corresponds to a semiconductor region containing one or more devices that are susceptible to or otherwise require protection from externally-generated electromagnetic fields. Thus, region 110 is often referred to herein as an "electromagnetic-field-susceptible" region. An example of such a region is an NRAM memory cell. In this regard, the term "externally-generated" includes fields that are generated by nearby components or semiconductor devices as well as fields existing in the external environment.

As shown in the illustrated embodiment, a dual-metal shield structure 115 is provided for shielding electromagnetic-field-susceptible region 110. Shield structure includes a stress-relief layer 120 formed over semiconductor component 119 in a shield region 114 that substantially corresponds to electromagnetic-field-susceptible region 110. The term "shield region" refers to the region in which shield structure 115 is formed, and may be equal to or larger than region 110, as will be discussed in greater detail below.

Stress-relief layer 120 and magnetic shield layer 130 each have a corresponding stress condition that, in accordance with the illustrated embodiment, are such that the residual stresses of the two layers substantially cancel out. As used herein, "stress condition" refers to a qualitative and quantitative measure of the as-formed mechanical stress present within the film layer. In a typical embodiment, for example, layer 120, may have a tensile stress condition (i.e., it is under tension laterally, and would tend to curve upward if unrestrained), while layer 130 has a compressive stress condition (i.e., it is under compression laterally, and would tend to curve downward if unrestrained). In such a case, where the stress condition of layer 120 is opposite that of layer 130, the effective resultant stress is greatly reduced while still providing suitable shielding capability.

Figure 2:
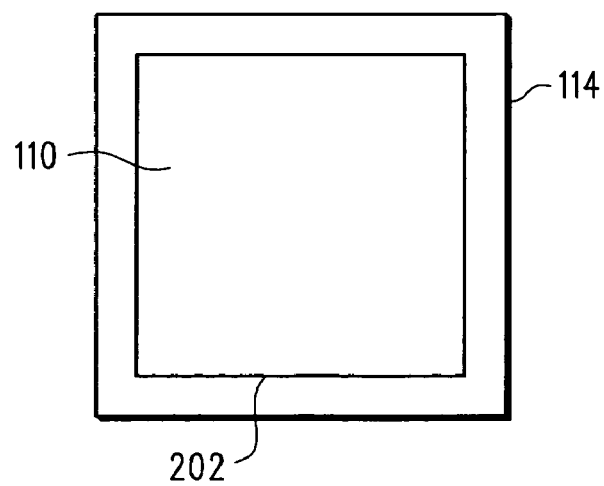
FIG. 2 is a top view showing the relationship between shield area and electromagnetic-field-susceptible region in accordance with one embodiment.

Shield region 114 substantially corresponds to region 110 in the sense that it is desirable that shield structure 115 entirely cover region 110 to provide maximum protection. Shield structure 115 may, however, overlap region 110. That is, referring to the top-view shown in FIG. 2, region 110 may have a perimeter 202 that is entirely encompassed by shield region 114. It will be appreciated that the extent to which shield region 114 overlaps perimeter 202 may be selected to achieve any particular design goal. Furthermore, shield region 114 need not be rectangular, and may have any suitable size and shape.

The thicknesses, materials, and processing methods used for layers 120 and 130 may be determined using known analytical techniques—i.e., via computer modeling and simulation, or empirical experiments. In one embodiment, stress-relief layer 120 comprises Ni—e.g., a high-purity electrodeposited Ni layer, as described below.

Shield layer 130 comprises any material having suitable magnetic shielding properties. In general, it is preferred that shield layer 130 be a "soft" magnetic material—i.e., a material with a relatively low coercivity. It is also preferred that the material have a relatively low remanence (the tendency to retain magnetization after removal of the field), high saturation (does not saturate below the field strength from which the device is to be shielded), and high permeability (to provide substantial field attenuation). In one embodiment, magnetic shield layer 130 comprises a NiFe alloy—e.g., an electrodeposited PERMALLOY or MUMETAL layer. PERMALLOY is nominally composed of 80% Ni and 20% Fe. MUMETAL is nominally composed of 80% Ni, 13.5% Fe, 4.9% Mo, 0.5% Mn, and 0.3% Si.

As is known, Ni layers exhibit a compressive stress condition as deposited (e.g., from about 25 to 45 MPa, depending upon thickness). The cited NiFe alloys exhibit a tensile stress condition as deposited (e.g., from about 100 to 145 MPa, depending upon thickness). Because of these opposing stress conditions, the resultant dual-layer shield structure, taken as a whole, exhibits low residual stress.

The thicknesses of the layers may be selected to achieved the desired stress reduction. In one embodiment, the NiFe layer is between 10 and 25 um, preferably about 18 um, and the Ni layer is about 6 um. Furthermore, while the exemplary Ni layer is illustrated as being formed under NiFe, the Ni layer may be formed on top of NiFe in alternate embodiments. That is, the two layers are adjacent, but need not be formed in any particular order.

Figure 3:
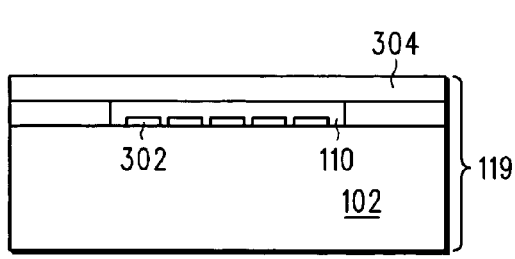
FIGS. 3-8 are successive cross-sectional images of a process used to manufacture a shield structure in accordance with one embodiment.

Referring to FIGS. 3-8, an exemplary method of fabricating a shield structure in accordance with the illustrated embodiment will now be described. Initially, as shown in FIG. 3, a semiconductor component 119 is provided. Semiconductor component 119 includes an electromagnetic-field-susceptible region 110—e.g., one or more MRAM memory cells 302. A polymer layer 304 is formed as the topmost layer of component 119—i.e., a layer of polyimide having a thickness of about 5 um.

Figure 4:
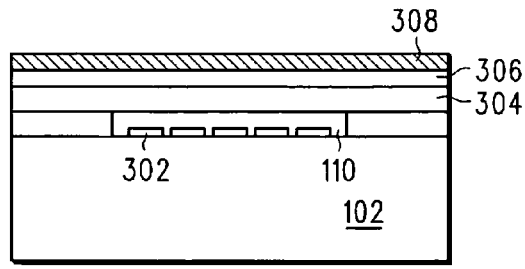

Next, as illustrated in FIG. 4, a "glue" layer 306 and a seed layer 308 are consecutively deposited over polymer layer 304. Glue layer 306 provides adhesion to polymer layer 304, while seed layer 308 provides a starting point for the subsequently-formed stress-relief layer. Toward this end, glue layer 306 may include, for example, a layer of TiW, Ta, TiN, or other suitable material. Seed layer comprises any suitable material, such as a thin seed layer of Cu. Together, glue layer 306 and seed layer 308 provide an interface to the subsequently formed layers, and may be deposited using, for example, a conventional PVD process.

Figure 5:
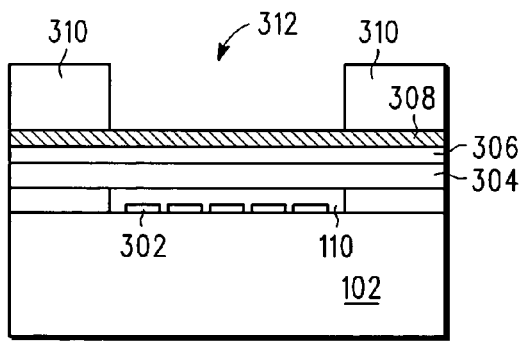

As illustrated in FIG. 5, a photosensitive resist (or "photoresist") layer 310 is deposited and patterned over seed layer 308 to form openings 312 corresponding to the desired shield region. In one embodiment, the photoresist layer 310 has a thickness of about 25 um thick, but any suitable thickness may be used. Deposition of layer 310 may be accomplished using conventional photoresist materials and techniques.

Figure 6:
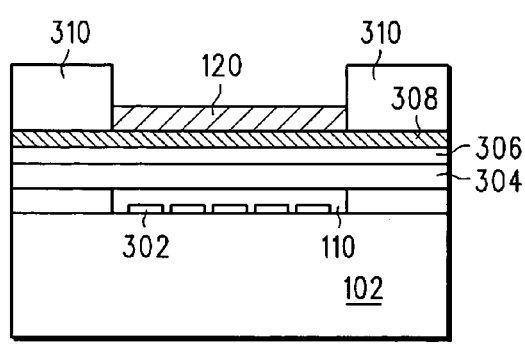

Next, as shown in FIG. 6, a stress-relief layer 120 is formed—e.g., an electrodeposited substantially pure Ni layer. In one embodiment, this step utilizes an electroplate bath generally consisting of 45 g/L Ni (Sulfamate), 35 g/L boric acid, 1.5 g/L saccharin, and 0.2-0.4 g/L wetting agent, at a pH ranging from about 3.8-4.2 and a temperature of 45-50° C.

Figure 7:
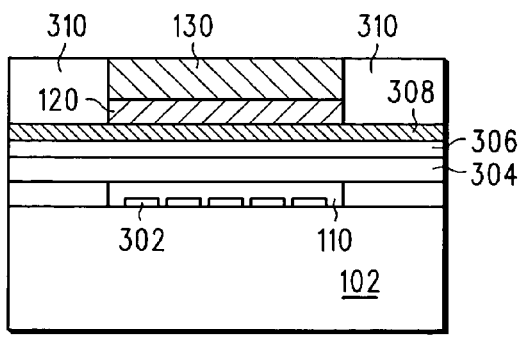
Figure 8:
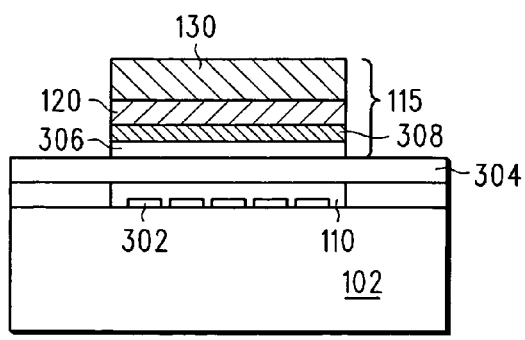

As shown in FIG. 7, magnetic shield layer 130 is then formed over layer 120. In one embodiment, magnetic shield layer 130 is an electrodeposited NiFe magnetic shield layer—specifically, a PERMALLOY layer having the composition 80Ni/20Fe. In one embodiment, this step utilizes an electroplate bath generally consisting of 40-50 g/L Ni (Sulfamate), 1.0-0.5 g/L Fe ($FeCl_2.6H_2O$), 25-30 g/L boric acid, 1.5 g/L saccharin, and 0.2-0.4 g/L wetting agent, at a pH of about 3.0 and a temperature of between 45-50° C. Note that the total thickness of layers 120 and 130 are determined by the thickness of photoresist layer 310.

Finally, photoresist layer 310 is removed, and seed layer 308 and glue layer 306 are subsequently etched using a suitable dry or wet etching process. This process results in a shield structure 115 over region 110 shown in FIG. 8.

Figure 9:
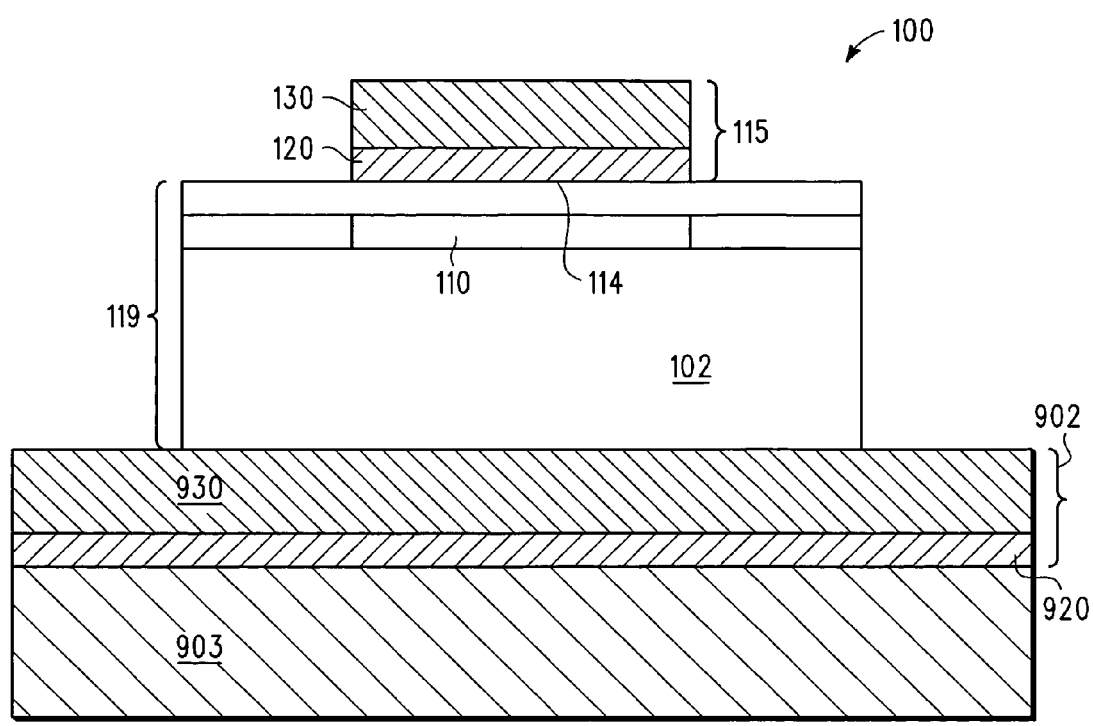
FIG. 9 is a cross-sectional image of a semiconductor attached to a leadframe in accordance with an alternate embodiment.

In an alternate embodiment, a shield structure is formed on the underside of the die or on the topside of the "flag" or leadframe area to which the die is bonded. That is, referring to FIG. 9, a second dual-metal shield structure 902 is formed over a leadframe 903 (e.g., a copper leadframe used as a packaging component) utilizing processes as outlined above. Shield structure 902 includes a magnetic shield layer 930 and a stress-relief layer 920, the thicknesses of which may be selected to achieve the desired stress reduction. Other types of packages, such as BGA packages, do not employ a leadframe but could nevertheless incorporate the shield structure disclosed above on any appropriate substrate. Various other layers such as plating and die bond layers have been removed in this figure for the sake of clarity.

The second shield structure 902 formed on leadframe 903 helps to shield region 110 from external magnetic fields that may arise from below substrate 102. Indeed, the dual-metal shield structures shown in the various embodiments may be deposited on any suitable surface, including die edges, sides of dielectric structures, and the like.

In summary, a shield structure for shielding an electromagnetic-field-susceptible region of a semiconductor component includes: a stress-relief layer formed over the semiconductor component in a shield region substantially corresponding to the electromagnetic-field-susceptible region, wherein the stress-relief layer has a first stress condition; and a magnetic shield layer mechanically coupled to the stress-relief layer within the shield region, wherein the magnetic shield layer has a second stress condition that is substantially opposite of the first stress condition. In one embodiment, the first stress condition is tensile, and the second stress condition is compressive.

The stress-relief layer may comprise a Ni layer, for example, an electroplated Ni layer. The magnetic shield layer may comprise a NiFe alloy, such as an electroplated NiFe alloy. In one embodiment, the magnetic shield layer has a composition consisting of approximately 80% Ni and 20% Fe. The electromagneticfield-susceptible region may have a perimeter that is entirely encompassed by the shield region.

A method of forming a shield structure for shielding an electromagnetic-field-susceptible region of a semiconductor component includes: forming a stress-relief layer over the semiconductor component within a shield region substantially corresponding to the electromagnetic-field-susceptible region of the semiconductor device such that the stress-relief layer has a first stress condition; and forming a magnetic shield layer over the stress-relief layer within the shield region such that the magnetic shield layer has a second stress condition that is substantially opposite of the first stress condition.

In one embodiment, forming the stress-relief layer includes depositing a Ni layer, e.g., using an electroplating process. In another embodiment, forming the magnetic shield layer comprises forming a NiFe alloy using an electroplating process. The magnetic shield layer may be formed by electroplating a layer comprising approximately 80% Ni and 20% Fe. In a further embodiment, forming the magnetic shield layer includes forming the magnetic shield layer such that the electromagnetic-field-susceptible region has a perimeter that is entirely encompassed by the shield region.

The method may further include forming a polymer layer over the semiconductor component prior to the forming of the stress-relief layer, and/or forming a seed layer over the polymer layer prior to the forming of the stress-relief layer. In one embodiment, the semiconductor component is formed within a semiconductor die, and the method further includes: providing a package leadframe; forming a second stress-relief layer on a portion of the package leadframe; forming a second magnetic shield layer on the second stress-relief layer such that the second magnetic shield layer compensates for residual stress introduced by the second stress-relief layer; and attaching the semiconductor die to the package leadframe.

A magnetoresistive random access memory (MRAM) component in accordance with one embodiment includes: a ferromagnetic memory cell; a stress-relief layer formed over the ferromagnetic memory cell, wherein the stress-relief layer has a first stress condition; and a magnetic shield layer formed on the stress-relief layer, wherein the magnetic shield layer has a second stress condition that is substantially opposite of the first stress condition. In one embodiment, the stress-relief layer comprises an electroplated Ni layer, and the magnetic shield layer comprises an electroplated layer comprising approximately 80% Ni and 20% Fe. In another embodiment, the MRAM component further includes a nonconductive polymeric layer over the ferromagnetic memory cell, and a seed layer over the polymeric layer.

While at least one example embodiment has been presented in the foregoing detailed description, it should be appreciated that a vast number of variations exist. It should also be appreciated that the example embodiment or embodiments described herein are not intended to limit the scope, applicability, or configuration of the various embodiments in any way. Rather, the foregoing detailed description will provide those skilled in the art with a convenient road map for implementing the described embodiment or embodiments. It should be understood that various changes can be made in the function and arrangement of elements without departing from the scope of the appended claims and the legal equivalents thereof.

What is claimed is:

1. A shield structure for shielding an electromagnetic-field-susceptible region of a semiconductor component located on a substrate that has a top surface and a bottom surface, the structure comprising:
    a first shield structure formed over the semiconductor component and the top surface of the substrate, wherein the first shield structure includes
        a first stress-relief layer electrodeposited over the semiconductor component in a shield region substantially corresponding to the electromagnetic-field-susceptible region, wherein the first stress-relief layer has a first stress condition, and
        a first magnetic shield layer electrodeposited over the stress-relief layer and mechanically coupled to the first stress-relief layer within the shield region, wherein the first magnetic shield layer has a second stress condition that is substantially opposite of the first stress condition, wherein sides of the first stress-relief layer and sides of the first magnetic shield layer define a perimeter of the shield region;
    a leadframe; and
    a second shield structure formed on the leadframe, wherein the second shield structure includes
        a second stress-relief layer formed under the semiconductor component, wherein the second stress-relief layer has the first stress condition, and
        a second magnetic shield layer mechanically coupled to the second stress-relief layer, wherein the second magnetic shield layer has the second stress condition, and wherein the bottom surface of the substrate is mounted on the second shield structure.

2. The shield structure of claim 1, wherein the first stress condition is tensile, and the second stress condition is compressive.

3. The shield structure of claim 1, wherein the first stress-relief layer comprises a Ni layer.

4. The shield structure of claim 3, wherein the first stress-relief layer comprises an electroplated Ni layer.

5. The shield structure of claim 1, wherein the first magnetic shield layer comprises a NiFe alloy.

6. The shield structure of claim 5, wherein the first magnetic shield layer comprises an NiFe alloy.

7. The shield structure of claim 6, wherein the first magnetic shield layer has a composition consisting of approximately 80% Ni and 20% Fe.

8. The shield structure of claim 1, wherein the electromagnetic-field-susceptible region has a perimeter that is entirely encompassed by the shield region.

9. A method of forming a shield structure for shielding an electromagnetic-field-susceptible region of a semiconductor component located on a substrate that has a top surface and a bottom surface, the method comprising:
  forming a first shield structure over the semiconductor component and the top surface of the substrate, by
    electrodepositing a first stress-relief layer over the semiconductor component within an opening in a photoresist layer, wherein the opening defines a shield region that substantially corresponds to the electromagnetic-field-susceptible region of the semiconductor device, and the first stress-relief layer has a first stress condition, and
    electrodepositing a first magnetic shield layer over the first stress-relief layer within the opening, wherein the first magnetic shield layer has a second stress condition that is substantially opposite of the first stress condition;
  forming a second shield structure on a leadframe by
    forming a second stress-relief layer on the leadframe, wherein the second stress-relief layer has the first stress condition, and
    forming a second magnetic shield layer mechanically coupled to the second stress-relief layer, wherein the second magnetic shield layer has the second stress condition; and
  coupling the second shield structure to the bottom surface of the substrate.

10. The method of claim 9, wherein electrodepositing the first stress-relief layer comprises depositing a Ni layer.

11. The method of claim 9, wherein electrodepositing the first magnetic shield layer comprises electrodepositing a NiFe alloy.

12. The method of claim 11, wherein electrodepositing the first magnetic shield layer comprises electrodepositing a layer comprising approximately 80% Ni and 20% Fe.

13. The method of claim 9, wherein electrodepositing the first magnetic shield layer includes electrodepositing the first magnetic shield layer such that the electromagnetic-field-susceptible region has a perimeter that is entirely encompassed by the shield region.

14. The method of claim 9, further including forming a polymer layer over the semiconductor component prior to the electrodepositing of the first stress-relief layer.

15. The method of claim 14, further including forming a seed layer over the polymer layer prior to the electrodepositing of the first stress-relief layer, wherein the seed layer provides a starting point for the first stress-relief layer.

16. A magnetoresistive random access memory (MRAM) component comprising:
  a ferromagnetic memory cell on a substrate having a top surface and a bottom surface;
  a first shield structure formed over the ferromagnetic memory cell on the top surface of the substrate, wherein the first shield structure includes
    a first stress-relief layer electrodeposited over the ferromagnetic memory cell, wherein the first stress-relief layer has a first stress condition, and
    a first magnetic shield layer electrodeposited over the stress-relief layer, wherein the first magnetic shield layer has a second stress condition that is substantially opposite of the first stress condition, and wherein sides of the stress-relief layer and sides of the magnetic shield layer define a perimeter of a shield region;
  a leadframe coupled with the bottom surface of the substrate; and
  a second shield structure formed on the leadframe, wherein the second shield structure includes
    a second stress-relief layer, which has the first stress condition, and
    a second magnetic shield layer mechanically coupled to the second stress-relief layer, wherein the second magnetic shield layer has the second stress condition.

17. The MRAM component of claim 16, wherein the first stress-relief layer comprises an electrodeposited Ni layer, and the first magnetic shield layer comprises an electrodeposited layer comprising approximately 80% Ni and 20% Fe.

18. The MRAM component of claim 16, wherein the MRAM component further includes a non-conductive polymeric layer over the ferromagnetic memory cell, and a seed layer over the polymeric layer.

19. A shield structure for shielding an electromagnetic-field-susceptible region of a semiconductor component that is located on a substrate that has a top surface and a bottom surface, the structure comprising:
  a first shield structure formed over the semiconductor component and the top surface of the substrate, wherein the first shield structure includes
    a first stress-relief layer formed over the semiconductor component in a shield region substantially corresponding to the electromagnetic-field-susceptible region, wherein the first stress-relief layer has a first stress condition, and
    a first magnetic shield layer mechanically coupled to the first stress-relief layer within the shield region, wherein the first magnetic shield layer has a second stress condition that is substantially opposite of the first stress condition, wherein sides of the first stress-relief layer and sides of the first magnetic shield layer define a perimeter of the shield region;
  a leadframe; and
  a second shield structure formed on the leadframe, wherein the second shield structure includes
    a second stress-relief layer, which has the first stress condition, and
    a second magnetic shield layer mechanically coupled to the second stress-relief layer, wherein the second magnetic shield layer has the second stress condition, and wherein the second shield structure is coupled with the bottom surface of the substrate.

* * * * *